(12) United States Patent
Lee et al.

(10) Patent No.: US 11,767,472 B2
(45) Date of Patent: *Sep. 26, 2023

(54) SEMICONDUCTOR NANOCRYSTAL PARTICLES AND DEVICES INCLUDING THE SAME

(71) Applicant: SAMSUNG ELECTRONICS CO., LTD., Suwon-si (KR)

(72) Inventors: Jeong Hee Lee, Seongnam-si (KR); Eun Joo Jang, Suwon-si (KR); Hyun A Kang, Suwon-si (KR); Tae Hyung Kim, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/709,830

(22) Filed: Mar. 31, 2022

(65) Prior Publication Data

US 2022/0220379 A1 Jul. 14, 2022

Related U.S. Application Data

(63) Continuation of application No. 15/976,197, filed on May 10, 2018, now Pat. No. 11,319,487.

(30) Foreign Application Priority Data

May 11, 2017 (KR) .................. 10-2017-0058474

(51) Int. Cl.
*C09K 11/88* (2006.01)
*C09K 11/56* (2006.01)
(Continued)

(52) U.S. Cl.
CPC ........... *C09K 11/883* (2013.01); *C09K 11/02* (2013.01); *C09K 11/565* (2013.01); *B82Y 20/00* (2013.01);
(Continued)

(58) Field of Classification Search
CPC .................. C09K 11/883; C09K 11/565
See application file for complete search history.

(56) References Cited

U.S. PATENT DOCUMENTS 7,767,260 B2  8/2010  Peng et al.
8,377,333 B2  2/2013  Ramprasad
(Continued)

FOREIGN PATENT DOCUMENTS

KR   1020140143875 A   12/2014
KR    101525524 B1     5/2015
(Continued)

OTHER PUBLICATIONS

Extended European Search Report dated Oct. 2, 2018, of the corresponding European Patent Application No. 181717125.
(Continued)

*Primary Examiner* — Matthew E. Hoban
(74) *Attorney, Agent, or Firm* — CANTOR COLBURN LLP

(57) ABSTRACT

A semiconductor nanocrystal particle including zinc (Zn), tellurium (Te) and selenium (Se), a method of producing the same, and an electronic device including the same are disclosed. In the semiconductor nanocrystal particle, an amount of the tellurium is less than an amount of the selenium, the particle includes a core including a first semiconductor material including zinc, tellurium, and selenium and a shell disposed on at least a portion of the core and including a second semiconductor material having a different composition from the first semiconductor material, and the semiconductor nanocrystal particle emits blue light including a maximum peak emission at a wavelength of less than or equal to about 470 nanometers.

19 Claims, 13 Drawing Sheets

(51) Int. Cl.
*C09K 11/02* (2006.01)
*H10K 50/115* (2023.01)
*B82Y 20/00* (2011.01)
*B82Y 40/00* (2011.01)

(52) U.S. Cl.
CPC ............. *B82Y 40/00* (2013.01); *H10K 50/115* (2023.02); *Y10S 977/774* (2013.01); *Y10S 977/824* (2013.01); *Y10S 977/892* (2013.01); *Y10S 977/95* (2013.01)

(56) References Cited

U.S. PATENT DOCUMENTS

| | | | |
|---|---|---|---|
| 8,420,155 B2 | 4/2013 | Nie | |
| 8,901,333 B2 | 12/2014 | Tulsky et al. | |
| 8,906,265 B2 | 12/2014 | Breen et al. | |
| 9,284,484 B2 | 3/2016 | Jang et al. | |
| 9,534,168 B2 | 1/2017 | Breen et al. | |
| 9,570,549 B2 | 2/2017 | Jang et al. | |
| 9,834,724 B2 | 12/2017 | Kim et al. | |
| 10,147,844 B2 | 12/2018 | Kim et al. | |
| 10,647,917 B2* | 5/2020 | Lee | C09K 11/02 |
| 11,011,720 B2* | 5/2021 | Kim | H01L 51/0043 |
| 11,193,061 B2* | 12/2021 | Kim | C09K 11/883 |
| 11,319,487 B2* | 5/2022 | Lee | C09K 11/02 |
| 2005/0214536 A1 | 9/2005 | Schrier et al. | |
| 2010/0044635 A1 | 2/2010 | Breen et al. | |
| 2011/0175054 A1 | 7/2011 | Ren et al. | |
| 2013/0069018 A1 | 3/2013 | Zhu et al. | |
| 2014/0227862 A1 | 8/2014 | Song et al. | |
| 2014/0339497 A1 | 11/2014 | Qu et al. | |
| 2014/0361228 A1 | 12/2014 | Jang et al. | |
| 2016/0225958 A1 | 8/2016 | Kazama et al. | |
| 2017/0152436 A1 | 6/2017 | Jang et al. | |
| 2018/0094190 A1 | 4/2018 | Kim et al. | |

FOREIGN PATENT DOCUMENTS

| | | |
|---|---|---|
| KR | 1699540 B1 | 1/2017 |
| KR | 1020170078928 A | 7/2017 |
| WO | 2005001889 A1 | 1/2005 |
| WO | 2008063652 A1 | 5/2008 |

OTHER PUBLICATIONS

Li, C. et al., "Synthesis of Cd-free water-soluble ZnSe1-xTex nanocrystals with high luminescence in the blue region", Journal of Colloid and Interface Science, Feb. 14, 2008, pp. 468-476, vol. 321, No. 2, ScienceDirect.

English Translation of Office Action dated Feb. 1, 2023 of the corresponding Korean Patent Application No. 10-2018-0053707, 10 pp.

K G Sonawance et al. "A case study: Te in ZnSe and Mn-doped ZnSe quantum dots". Nanotechnology 22, Jun. 27, 2011, pp. 1-7.

Office Action dated Feb. 1, 2023 of the corresponding Korean Patent Application No. 10-2018-0053707, 8 pp.

Non-Final Office Action dated Nov. 10, 2022 in U.S. Appl. No. 17/532,439.

Notice of Allowance dated Feb. 15, 2022 of the corresponding Korean Patent Application No. 10-2017-0139603.

* cited by examiner

SEMICONDUCTOR NANOCRYSTAL PARTICLES AND DEVICES INCLUDING THE SAME

CROSS-REFERENCE TO RELATED APPLICATION

This application is a continuation application of application Ser. No. 15/976,197, filed May 10, 2018, which claims priority to Korean Patent Application No. 10-2017-0058474 filed in the Korean Intellectual Property Office on May 11, 2017, and all the benefits accruing therefrom under 35 U.S.C. § 119, the entire contents of which are incorporated herein by reference.

BACKGROUND

1. Field

A semiconductor nanocrystal particle and a device including the same are disclosed.

2. Description of the Related Art

Unlike bulk materials, intrinsic physical characteristics (e.g., energy bandgaps and melting points) of nanoparticles may be controlled by changing the nanoparticle sizes. For example, a semiconductor nanocrystal particle (also known as a quantum dot) is a crystalline material having a size of several nanometers. The semiconductor nanocrystal particle has such a small size that it has a large surface area per unit volume and exhibits a quantum confinement effect, and thus may have different properties than bulk materials having the same composition. A quantum dot may absorb light from an excitation source to be excited, and may emit energy corresponding to its energy bandgap.

Quantum dots may be synthesized using a vapor deposition method such as metal organic chemical vapor deposition (MOCVD), molecular beam epitaxy (MBE), or the like, a wet chemical method including adding precursor materials to an organic solvent to grow crystals, or the like. In the wet chemical method, organic compounds such as ligands/coordinating solvents may be coordinated on, e.g., bound to, surfaces of nanocrystals to control a crystal growth during the crystal growth.

SUMMARY

An embodiment provides a cadmium-free semiconductor nanocrystal particle capable of emitting blue light with improved efficiency.

An embodiment provides a method of manufacturing the semiconductor nanocrystal particle.

An embodiment provides an electronic device including the semiconductor nanocrystal particle.

In an embodiment, a semiconductor nanocrystal particle includes zinc (Zn), tellurium (Te) and selenium (Se), wherein an amount of the tellurium is less than an amount of the selenium (wherein if the amount of Te is a and the amount of Se is b, a<b), the particle includes a core including a first semiconductor material including zinc, tellurium, and selenium and a shell disposed on at least a portion of the core and including a second semiconductor material having a different composition from the first semiconductor material, and the semiconductor nanocrystal particle emits blue light including a maximum peak emission at a wavelength of less than or equal to about 470 nanometers (nm).

The semiconductor nanocrystal particle may have a mole ratio of the tellurium to the selenium of less than or equal to about 0.05:1 (for example, as measured by an inductively coupled plasma-atomic emission spectroscopy (ICP-AES)).

In the semiconductor nanocrystal particle, for example, the mole ratio of the tellurium to the selenium may be less than about 0.024:1.

In the semiconductor nanocrystal particle, an amount of the zinc may be greater than an amount of the selenium.

The semiconductor nanocrystal particle may have a mole ratio of the tellurium to the zinc of less than or equal to about 0.03:1 (for example, as measured by an inductively coupled plasma-atomic emission spectroscopy).

The semiconductor nanocrystal particle may include the tellurium in an amount of about 1 weight percent (wt %) or less, based on a total weight thereof.

The first semiconductor material may include $ZnTe_xSe_{1-x}$ (wherein, x is greater than about 0 and less than or equal to about 0.05).

A size of the core may be greater than or equal to about 2 nm.

A size of the core may be less than or equal to about 6 nm.

The second semiconductor material may include zinc, selenium, and sulfur.

The shell may include a plurality of layers and adjacent layers of the plurality of the layers may include semiconductor materials different from each other.

The shell may include a first layer disposed directly on the core and an outermost layer, wherein the first layer may include ZnSeS and the outermost layer may include ZnS.

The semiconductor nanocrystal particle may emit blue light having maximum peak emission that may be at a wavelength of about 430 nm to about 470 nm.

The maximum peak emission may have a full width at half maximum (FWHM) of less than or equal to about 50 nm.

The semiconductor nanocrystal particle may have quantum efficiency of greater than or equal to about 60%.

The semiconductor nanocrystal particle may have a size of greater than or equal to about 3 nm.

The semiconductor nanocrystal particle may have a size of less than or equal to about 50 nm.

The semiconductor nanocrystal particle may not include cadmium.

The semiconductor nanocrystal particle may have a multi-pod shape.

In an embodiment, a method of producing the semiconductor nanocrystal particle includes preparing a zinc precursor solution including a zinc precursor and an organic ligand;

heating the zinc precursor solution at a first reaction temperature and adding a selenium precursor and a tellurium precursor, and optionally together with an organic ligand, thereto to form a first semiconductor nanocrystal core including zinc, selenium, and tellurium;

preparing a first shell precursor solution including a metal-containing first shell precursor and an organic ligand; and heating the first shell precursor solution at a second reaction temperature and adding the first semiconductor nanocrystal core and a second shell precursor thereto to form a shell of a second semiconductor nanocrystal on the first semiconductor nanocrystal core, the second shell precursor comprising a non-metal element.

The method may include separating the first semiconductor nanocrystal core and dispersing it in an organic solvent to prepare a core solution.

The zinc precursor may include a Zn powder, an alkylated Zn compound, a Zn alkoxide, a Zn carboxylate, a Zn nitrate, a Zn perchlorate, a Zn sulfate, a Zn acetylacetonate, a Zn halide, a Zn cyanide, a Zn hydroxide, or a combination thereof.

The selenium precursor may include selenium-trioctylphosphine (Se-TOP), selenium-tributylphosphine (Se-TBP), selenium-triphenylphosphine (Se-TPP), selenium-diphenylphosphine (Se-DPP), or a combination thereof.

The tellurium precursor may include tellurium-trioctylphosphine (Te-TOP), tellurium-tributylphosphine (Te-TBP), tellurium-triphenylphosphine (Te-TPP), or a combination thereof.

An amount of the selenium precursor may be greater than or equal to about 20 moles (mols), based on one mole of the tellurium precursor.

An amount of the selenium precursor may be less than or equal to about 60 mols, based on one mole of the tellurium precursor.

The first shell precursor may include zinc, and the second shell precursor may include selenium, sulfur, or a combination thereof.

The organic ligand may include RCOOH, $RNH_2$, $R_2NH$, $R_3N$, RSH, $RH_2PO$, $R_2HPO$, $R_3PO$, $RH_2P$, $R_2HP$, $R_3P$, ROH, RCOOR, $RPO(OH)_2$, RHPOOH, $R_2POOH$ (wherein, R is the same or different and independently is a C1 to C24 substituted or unsubstituted aliphatic hydrocarbon group, a C6 to C20 substituted or unsubstituted aromatic hydrocarbon group, or a combination thereof), or a combination thereof.

In an embodiment, an electronic device includes the aforementioned semiconductor nanocrystal particle.

The electronic device may be a display device, a light emitting diode (LED), a quantum dot light emitting diode (QLED), an organic light emitting diode (OLED), a sensor, an image sensor, or a solar cell electronic device.

A cadmium-free semiconductor nanocrystal particle capable of emitting blue light may be provided. The semiconductor nanocrystal particle may be applied to various display devices, biolabeling (biosensor, bioimaging), a photodetector, a solar cell, a hybrid composite, or the like.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1:
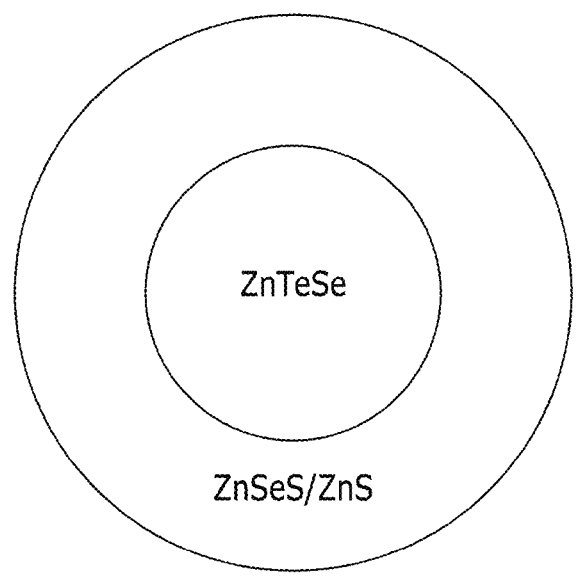
FIG. 1 is a schematic cross-sectional view of a semiconductor nanocrystal according to a non-limiting embodiment.

Advantages and characteristics of this disclosure, and a method for achieving the same, will become evident referring to the following example embodiments together with the drawings attached hereto. However, the embodiments should not be construed as being limited to the embodiments set forth herein. Unless otherwise defined, all terms used in the specification (including technical and scientific terms) may be used with meanings commonly understood by a person having ordinary knowledge in the art. The terms defined in a generally-used dictionary may not be interpreted ideally or exaggeratedly unless clearly defined. In addition, unless explicitly described to the contrary, the word "comprise" and variations such as "comprises" or "comprising", will be understood to imply the inclusion of stated elements but not the exclusion of any other elements.

Further, the singular includes the plural unless mentioned otherwise.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as being limited to "a" or "an." "or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, when a definition is not otherwise provided, "substituted" refers to a compound or a moiety wherein at least one of hydrogen atoms thereof is replaced by a substituent, wherein the substituent may be a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—NO$_2$), a cyano group (—CN), an amino group (—NRR' wherein R and R' are independently hydrogen or a C1 to C6 alkyl group), an azido group (—N$_3$), an amidino group (—O(=NH)NH$_2$)), a hydrazino group (—NHNH$_2$), a hydrazono group (=N(NH$_2$)), an aldehyde group (—C(=O)H), a carbamoyl group (—C(O)NH$_2$), a thiol group (—SH), an ester group (—C(=O)OR, wherein R is a C1 to C6 alkyl group or a C6 to C12 aryl group), a carboxyl group (—COOH) or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), or a combination thereof.

As used herein, "aliphatic" refers to a saturated or unsaturated linear or branched hydrocarbon group. An aliphatic group may be an alkyl, alkenyl, or alkynyl group, for example.

As used herein, "aromatic" means an organic compound or group comprising at least one unsaturated cyclic group having delocalized pi electrons. The term encompasses both hydrocarbon aromatic compounds and heteroaromatic compounds.

As used herein, a hydrocarbon group refers to a group including carbon and hydrogen (e.g., an alkyl, alkenyl, alkynyl, or aryl group). The hydrocarbon group may be a group having a monovalence or greater formed by removal of one or more hydrogen atoms from, alkane, alkene, alkyne, or arene. In the hydrocarbon group, at least one methylene may be replaced by an oxide moiety, a carbonyl moiety, an ester moiety, —NH—, or a combination thereof. As used herein, "alkyl" refers to a linear or branched saturated monovalent hydrocarbon group (methyl, ethyl hexyl, etc.).

As used herein, "alkenyl" refers to a linear or branched monovalent hydrocarbon group having one or more carbon-carbon double bond.

As used herein, "alkynyl" refers to a linear or branched monovalent hydrocarbon group having one or more carbon-carbon triple bond.

As used herein, "aryl" refers to a group formed by removal of at least one hydrogen from an aromatic group (e.g., a phenyl or naphthyl group).

As used herein, "hetero" refers to one including one or more (e.g., 1 to 3) heteroatom of N, O, S, Si, P, or a combination thereof.

As used herein, "Group" refers to a group of Periodic Table.

A core-shell structure may improve photoluminescence properties of quantum dots, but most of conventional core-shell quantum dots having desirable properties may include cadmium. Provided herein are cadmium-free semiconductor nanocrystal particles having desirable photoluminescence properties.

Semiconductor nanocrystal particles (hereinafter, also referred to as a quantum dot) may absorb light from an excitation source and may emit light corresponding to an energy bandgap thereof. The energy bandgap of the quantum dot may be changed depending on a size and a composition thereof. For example, as the size of the quantum dot increases, the quantum dot may have a narrower energy bandgap and may show an increased light emitting wavelength. Semiconductor nanocrystals have drawn attention as a light emitting material in various fields such as a display device, an energy device, or a bio light emitting device.

Quantum dots having photoluminescence properties may include cadmium (Cd). The cadmium may raise severe environmental and/or health issues and is a restricted element defined under Restriction of Hazardous Substances Directive (RoHS) in a plurality of countries. Accordingly, there remain needs for development of a cadmium-free quantum dot having improved photoluminescence characteristics. In order to be applied to a QLED display device, a quantum dot having a relatively narrow full width at half maximum (FWHM) and capable of emitting light of pure blue (e.g., PL peak around 455 nm) is desired. For example, a blue light emitting material is required for a display device having a relatively high (e.g., about 90% or greater) color reproducibility under a next generation color standard such as BT2020. A cadmium-free quantum dot having desirable photoluminescence properties and PL peak within the foregoing ranges is provided.

A semiconductor nanocrystal particle according to an embodiment has a structure and a composition that will be described herein, and thereby may not include cadmium while emitting blue light.

The semiconductor nanocrystal particle includes zinc (Zn), tellurium (Te) and selenium (Se). In the semiconductor nanocrystal particle, an amount of the tellurium is less than that of the selenium. The particle may have a core-shell structure having a core including a first semiconductor material including zinc, tellurium, and selenium and a shell that is disposed on at least a portion of the core and includes a second semiconductor material having a different composition from the first semiconductor material (see FIG. 1). The semiconductor nanocrystal particle emits blue light having a maximum peak emission at a wavelength of less than or equal to about 470 nm. The first semiconductor material of the core may include a ZnSe material including a small amount of tellurium (Te). The core may have a cubic (zinc blend) crystal structure. The core may include $ZnTe_xSe_{1-x}$ (wherein, x is greater than about 0 and less than or equal to about 0.05). The wavelength of the maximum light emitting peak of the semiconductor nanocrystal particle may be increased by increasing a ratio of an amount of tellurium relative to an amount of selenium in the core. In the core, the amount of the tellurium may be greater than or equal to about 0.001 moles, greater than or equal to about 0.005 moles, greater than or equal to about 0.006 moles, greater than or equal to about 0.007 moles, greater than or equal to about 0.008 moles, greater than or equal to about 0.009 moles, greater than or equal to about 0.01 moles, or greater than or equal to about 0.02 moles based on one mole of the selenium. In the core, the amount of the tellurium may be less than or equal to about 0.053 moles, for example, less than or equal to about 0.05 moles, less than or equal to about 0.049 moles, less than or equal to about 0.048 moles, less than or equal to about 0.047 moles, less than or equal to about 0.046 moles, less than or equal to about 0.045 moles, less than or equal to about 0.044 moles, less than or equal to about 0.043 moles, less than or equal to about 0.042 moles, less than or equal to about 0.041 moles, or less than or equal to about 0.04 mol based on one mole of the selenium. Without being bound by any particular theory, the core may have various forms in terms of distributions of Zn, Se, and Te.

In the core, Te may be dispersed in a ZnSe crystal structure. The (average) size of the core may be greater than or equal to about 2 nm, greater than or equal to about 3 nm, or greater than or equal to about 4 nm. The (average) size of the core may be less than or equal to about 6 nm, for example less than or equal to about 5 nm.

The second semiconductor material may include a Group II-VI compound, a Group III-V compound, a Group IV-VI compound, a Group IV element or compound, a Group I-III-VI compound, a Group I-II-IV-VI compound, or a combination thereof. The Group II-VI compound may be a binary element compound such as CdSe, CdTe, ZnS, ZnSe, ZnTe, ZnO, HgS, HgSe, HgTe, MgSe, MgS, or a mixture thereof; a ternary element compound such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, or a mixture thereof; or a quaternary element compound such as HgZnTeS, CdZnSeS, CdZnSeTe, CdZnSTe, CdHgSeS, CdHgSeTe, CdHgSTe, HgZnSeS, HgZnSeTe, HgZnSTe, or a mixture thereof. The Group III-V compound may be a binary element compound such as GaN, GaP, GaAs, GaSb, AlN, AlP, AlAs, AlSb, InN, InP, InAs, InSb, or a mixture thereof; a ternary element compound such as GaNP, GaNAs, GaNSb, GaPAs, GaPSb, AlNP, AlNAs, AlNSb, AlPAs, AlPSb, InNP, InNAs, InNSb, InPAs, InPSb, or a mixture thereof; or a quaternary element compound such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a mixture thereof. The IV-VI compound may be a binary element compound such as SnS, SnSe, SnTe, PbS, PbSe, PbTe, or a mixture thereof; a ternary element compound such as SnSeS, SnSeTe, SnSTe, PbSeS, PbSeTe, PbSTe, SnPbS, SnPbSe, SnPbTe or a mixture thereof; or a quaternary element compound such as SnPbSSe, SnPbSeTe, SnPbSTe, or a mixture thereof. Examples of the Group I-III-VI compound may include $CuInSe_2$, $CuInS_2$, CuInGaSe, and CuInGaS, but are not limited thereto. Examples of the Group I-II-IV-VI compound may include CuZnSnSe and CuZnSnS, but are not limited thereto. The Group IV element or compound may be a single element such as Si, Ge, or a mixture thereof; or a binary element compound such as SiC, SiGe, or a mixture thereof. The Group III-V compound may further include a Group 11 metal (e.g., InZnP etc.).

The shell may be a multi-layered shell including a plurality of layers. Adjacent layers of the plurality of layers may include semiconductor materials having different compositions from each other. The shell may be a gradient alloy having a composition that changes in a radial direction.

A thickness of the shell may be greater than or equal to about 0.5 nm, for example, greater than or equal to about 1 nm, greater than or equal to about 2 nm, greater than or equal to about 3 nm, greater than or equal to about 4 nm, or greater than or equal to about 5 nm. A thickness of the shell may be less than or equal to about 10 nm, less than or equal to about 9 nm, less than or equal to about 8 nm, less than or equal to about 7 nm, less than or equal to about 6 nm, less than or equal to about 5 nm, or less than or equal to about 4 nm. The thickness of the shell may be determined (calculated) from the sizes of the core and the semiconductor nanocrystal particle.

In an embodiment, the second semiconductor material may include zinc (Zn), selenium (Se), and sulfur (S). The shell may be a multi-layered shell such as at least two-layered shell, at least three-layered shell, at least four-layered shell, or the like. The multi-layered shell may include a first layer disposed directly on the core and outermost layer and the first layer may include ZnSeS and the outermost layer may include ZnS. The shell may be a gradient alloy and an amount of sulfur may have a concentration gradient that increases as being apart from the core.

The semiconductor nanocrystal particle may have a ratio of a mole amount of the tellurium relative to that of selenium (e.g., measured by inductively coupled plasma-atomic emission spectroscopy (ICP-AES)) of less than or equal to about 0.05:1, less than or equal to about 0.049:1, less than or equal to about 0.048:1, less than or equal to about 0.047:1, less than or equal to about, 0.045:1, less than or equal to about 0.044:1, less than or equal to about 0.043:1, less than or equal to about 0.042:1, less than or equal to about 0.041:1, less than or equal to about 0.04:1, less than or equal to about 0.039:1, less than or equal to about 0.035:1, less than or equal to about 0.03:1, less than or equal to about 0.029:1, less than or equal to about 0.025:1, less than or equal to about 0.024:1, less than or equal to about 0.023:1, less than or equal to about 0.022:1, less than or equal to about 0.021:1, less than or equal to about 0.02:1, less than or equal to about 0.019:1, less than or equal to about 0.018:1, less than or equal to about 0.017:1, less than or equal to about 0.016:1, less than or equal to about 0.015:1, less than or equal to about 0.014:1, less than or equal to about 0.013:1, less than or equal to about 0.012:1, less than or equal to about 0.011:1, or less than or equal to about 0.01:1. The mole ratio of the tellurium to the selenium may be greater than or equal to about 0.001:1, greater than or equal to about 0.002:1, greater than or equal to about 0.003:1, greater than or equal to about 0.004:1, greater than or equal to about 0.005:1, greater than or equal to about 0.006:1, or greater than or equal to about 0.007:1. The mole ratio of the tellurium to the selenium may be about 0.004:1 to about 0.025:1. The mole ratio of the tellurium to the selenium may be about 0.004 to about 0.023.

In the semiconductor nanocrystal particle, an amount of the zinc may be greater than that of the selenium. In the semiconductor nanocrystal particle, an amount of the zinc may be greater than that of the tellurium.

An amount of zinc (Zn) may be greater than that of selenium (Se) and an amount of selenium may be greater than that of tellurium, for example when being confirmed by an ICP-AES analysis of the semiconductor nanocrystal particle.

For example, in the ICP-AES analysis, a mole ratio of Se to Zn may be less than about 1:1, for example, less than or equal to about 0.95:1, less than or equal to about 0.90:1, less than or equal to about 0.85:1, or less than or equal to about 0.8:1.

For example, in an ICP-AES analysis, a mole ratio of Te to Zn may be less than or equal to about 0.03:1, for example, less than or equal to about 0.027:1, less than or equal to about 0.025:1, less than or equal to about 0.02:1, less than or equal to about 0.019:1, less than or equal to about 0.018:1, less than or equal to about 0.017:1, less than or equal to about 0.016:1, less than or equal to about 0.015:1, less than or equal to about 0.014:1, less than or equal to about 0.013:1, less than or equal to about 0.012:1, less than or equal to about 0.011:1, less than or equal to about 0.01:1, less than or equal to about 0.009:1, less than or equal to about 0.008:1, less than or equal to about 0.007:1, less than or equal to about 0.006:1, or less than or equal to about 0.005:1. The mole ratio of Te to Zn may be greater than or equal to about 0.001:1, greater than or equal to about 0.002:1, or greater than or equal to about 0.003:1. In a semiconductor nanocrystal particle according to an embodiment, an amount of tellurium may be less than or equal to about 1 wt % based on a total weight of the semiconductor nanocrystal particle. The semiconductor nanocrystal particle may not include cadmium.

In the semiconductor nanocrystal particle, a mole ratio of sulfur to Zn may be greater than or equal to about 0.1:1, for example greater than or equal to about 0.15:1, or greater than or equal to about 0.2:1. In the semiconductor nanocrystal particle, the mole ratio of sulfur to Zn may be less than or equal to about 0.5:1, for example less than or equal to about 0.45:1. In the semiconductor nanocrystal particle, a mole ratio of Se and S to zinc may be greater than or equal to about 0.3:1, greater than or equal to about 0.4:1, or greater than or equal to about 0.5:1. In the semiconductor nanocrystal particle, a mole ratio of Se and S to zinc may be less than or equal to about 1:1, for example less than or equal to about 0.9:1.

The semiconductor nanocrystal may include various shapes. The semiconductor nanocrystal may include a spherical shape, a polygonal shape, a multipod shape, or a combination thereof. In an embodiment, the semiconductor nanocrystal particle may have a multipod shape. The multipod may have at least two (e.g., at least three or at least four) branch parts and a valley part therebetween.

A size of the semiconductor nanocrystal particle may be greater than or equal to about 3 nm, for example greater than or equal to about 4 nm, greater than or equal to about 5 nm, or greater than or equal to about 6 nm. The size of the semiconductor nanocrystal may be less than or equal to about 50 nm, for example less than or equal to about 45 nm, less than or equal to about 40 nm, less than or equal to about 35 nm, less than or equal to about 30 nm, less than or equal to about 25 nm, less than or equal to about 24 nm, less than or equal to about 23 nm, less than or equal to about 22 nm, less than or equal to about 21 nm, less than or equal to about 20 nm, less than or equal to about 19 nm, less than or equal to about 18 nm, less than or equal to about 17 nm, or less than or equal to about 16 nm. Herein, when the semiconductor nanocrystal particle has a spherical shape, the size of the semiconductor nanocrystal may be a diameter. When the particle has a polygonal or multipod shape, the size of the particle may be the longest linear length of, e.g., crossing or across, the particle. The size of the semiconductor nanocrystal particle (or the core) may be determined by for example, a Transmission Electron Microscope, but it is not limited thereto.

A semiconductor nanocrystal particle according to an embodiment may emit blue light having a maximum peak emission at a wavelength of greater than or equal to about 430 nm (e.g., greater than or equal to about 440 nm, greater than or equal to about 445 nm, or greater than or equal to about 450 nm) and less than or equal to about 470 nm (e.g., less than about 470 nm, less than or equal to about 465 nm, or less than or equal to about 460 nm). The blue light may have a maximum light-emitting peak wavelength of from about 450 nm to about 460 nm. The maximum peak emission may have a full width at half maximum (FWHM) of less than or equal to about 50 nm, for example, less than or equal to about 49 nm, less than or equal to about 48 nm, less than or equal to about 47 nm, less than or equal to about 46 nm, less than or equal to about 45 nm, less than or equal to about 44 nm, less than or equal to about 43 nm, less than or equal to about 42 nm, less than or equal to about 41 nm, less than or equal to about 40 nm, less than or equal to about 39 nm, less than or equal to about 38 nm, less than or equal to about 37 nm, less than or equal to about 36 nm, less than or equal to about 35 nm, less than or equal to about 34 nm, less than or equal to about 33 nm, less than or equal to about 32 nm, less than or equal to about 31 nm, less than or equal to about 30 nm, less than or equal to about 29 nm, or less than or equal to about 28 nm.

The semiconductor nanocrystal may have quantum efficiency of greater than or equal to about 60%, for example, greater than or equal to about 61%, greater than or equal to about 62%, greater than or equal to about 63%, greater than or equal to about 64%, greater than or equal to about 65%, greater than or equal to about 66%, greater than or equal to about 67%, greater than or equal to about 68%, or greater than or equal to about 69%. The semiconductor nanocrystal may have quantum efficiency of greater than or equal to about 80%, greater than or equal to about 90%, greater than or equal to about 95%, greater than or equal to about 99%, or about 100%.

A core-shell semiconductor nanocrystal including cadmium such as CdSe/CdS may exhibit high photoluminescence properties and stability against photooxidation by passivation of the surface of the nanocrystal. Surfaces of these nanocrystals may be capped by an inorganic shell having a wide bandgap. The inorganic shell passivates the surface of the nanocrystal, effectively and/or drastically, e.g., significantly, removes a dangling bond or a coordination portion that form a trap for carriers formed inside the nanocrystal, and thus photo-generated carriers may be confined inside the core and relatively high luminous efficiency may be realized. However, such a core-shell type semiconductor nanocrystal generally has a maximum light emitting wavelength (i.e., a central light emitting wavelength) of about 470 nm to about 630 nm and it may be difficult to have, e.g., realize, a maximum light emitting wavelength of less than about 470 nm. Because the maximum light emitting wavelength of the semiconductor nanocrystal particles increases with an increase of a size of the nanocrystal, a core semiconductor nanocrystal having a very small size (e.g., less than 1.6 nm) may be necessary in order to obtain a maximum light emitting wavelength of less than 470 nm, but it may be difficult to produce a core having such a size with a narrow size distribution. Formation of the shell on the core may cause an increase (e.g., red-shift) in a maximum light emitting peak wavelength of the semiconductor nanocrystal. Therefore, it may be difficult to prepare a core-shell semiconductor nanocrystal that emits blue light.

The semiconductor nanocrystal according to an embodiment may exhibit a maximum light emitting peak wavelength of less than about 470 nm, for example, less than or equal to about 465 nm with relatively high quantum efficiency and a relatively narrow full width at half maximum (FWHM) even if it has a relatively large core size (e.g., about 2 nm or greater).

In an embodiment, a method of producing the semiconductor nanocrystal particle includes preparing a zinc precursor solution including a zinc precursor and an organic ligand;

obtaining a selenium precursor and a tellurium precursor;

heating the zinc precursor solution at a first reaction temperature and adding the selenium precursor and the tellurium precursor, optionally an organic ligand to form a first semiconductor nanocrystal core including zinc, selenium, and tellurium;

preparing a first shell precursor solution including a metal-containing first shell precursor and an organic ligand;

obtaining a second shell precursor including a non-metal element; and heating the first shell precursor solution at a second reaction temperature and adding the first semiconductor nanocrystal core and the second shell precursor thereto to form a shell of a second semiconductor nanocrystal on the first semiconductor nanocrystal core. The method may further include separating the first semiconductor nanocrystal core and dispersing it in an organic solvent to prepare a core solution.

The zinc precursor may include a Zn powder, ZnO, an alkylated Zn compound (e.g., C2 to C30 alkyl (e.g., dialkyl) zinc such as dimethyl zinc, diethyl zinc), a Zn alkoxide (e.g., a zinc ethoxide), a Zn carboxylate (e.g., a zinc acetate or zinc aliphatic carboxylate, for example, zinc long chain aliphatic carboxylate such as zinc oleate), a Zn nitrate, a Zn perchlorate, a Zn sulfate, a Zn acetylacetonate, a Zn halide (e.g., a zinc chloride), a Zn cyanide, a Zn hydroxide, or a combination thereof. The zinc precursor solution may include at least two kinds of organic ligands in an organic solvent. The at least two kinds of organic ligands may include fatty acid and amine compounds. In a zinc precursor solution, a concentration of the zinc precursor and a concentration of the organic ligand are not particularly limited and may be selected appropriately.

The selenium precursor may include selenium-trioctylphosphine (Se-TOP), selenium-tributylphosphine (Se-TBP), selenium-triphenylphosphine (Se-TPP), selenium-diphenylphosphine (Se-DPP), or a combination thereof, but is not limited thereto. The tellurium precursor may include tellurium-trioctylphosphine (Te-TOP), tellurium-tributylphosphine (Te-TBP), tellurium-triphenylphosphine (Te-TPP), or a combination thereof, but is not limited thereto.

An amount of the selenium precursor for forming the core may be greater than or equal to about 20 moles, for example, greater than or equal to about 25 moles, greater than or equal to about 26 moles, greater than or equal to about 27 moles, greater than or equal to about 28 moles, greater than or equal to about 29 moles, greater than or equal to about 30 moles, greater than or equal to about 31 moles, greater than or equal to about 32 moles, greater than or equal to about 33 moles, greater than or equal to about 34 moles, greater than or equal to about 35 moles, greater than or equal to about 36 moles, greater than or equal to about 37 moles, greater than or equal to about 38 moles, greater than or equal to about 39 moles, or greater than or equal to about 40 moles based on one mole of the tellurium precursor. The amount of the selenium precursor may be less than or equal to about 60 moles, less than or equal to about 59 moles, less than or equal to about 58 moles, less than or equal to about 57 moles, less than or equal to about 56 moles, or less than or equal to about 55 moles based on one mole of the tellurium precursor. Within the foregoing ranges of the amount, the core having the aforementioned composition may be formed.

The first reaction temperature may be greater than or equal to about 280° C., for example, greater than or equal to about 290° C. A reaction time for forming the core is not particularly limited and may be appropriately selected. For example, the reaction time may be greater than or equal to about 5 minutes, greater than or equal to about 10 minutes, greater than or equal to about 15 minutes, greater than or equal to about 20 minutes, greater than or equal to about 25 minutes, greater than or equal to about 30 minutes, greater than or equal to about 35 minutes, greater than or equal to about 40 minutes, greater than or equal to about 45 minutes, or greater than or equal to about 50 minutes, but is not limited thereto. For example, the reaction time may be less than or equal to about 2 hours, less than or equal to about 110 minutes, less than or equal to about 100 minutes, less than or equal to about 90 minutes, less than or equal to about 80 minutes, less than or equal to about 70 minutes, or less than or equal to about 60 minutes, but is not limited thereto. By controlling the reaction time, the size of the core may be controlled.

Hereinafter, shell precursors of the ZnSeS shell will be described in detail, but the present disclosure is not limited thereto, and desirable shell precursors may be selected in accordance with shell compositions.

In an embodiment, the first shell precursor may include zinc. The first shell precursor including zinc may be a zinc powder, alkylated zinc (e.g., C2 to C30 alkyl (e.g., dialkyl) zinc, e.g., dimethyl zinc, diethyl zinc), a zinc alkoxide, a zinc carboxylate (e.g., zinc aliphatic carboxylate, for example, zinc long chain aliphatic carboxylate such as zinc oleate), a zinc nitrate, a zinc perchlorate, a zinc sulfate, a zinc acetylacetonate, a zinc halide, a zinc cyanide, a zinc hydroxide, ZnO, a zinc peroxide, or a combination thereof, but is not limited thereto. Examples of the first shell precursor may be dimethyl zinc, diethyl zinc, a zinc acetate, a zinc acetylacetonate, a zinc iodide, a zinc bromide, a zinc chloride, a zinc fluoride, a zinc carbonate, a zinc cyanide, a zinc nitrate, a zinc oxide, a zinc peroxide, a zinc perchlorate, a zinc sulfate, or a combination thereof.

The second shell precursor includes selenium, sulfur, or a combination thereof. The sulfur-containing precursor of the second shell precursor may be hexane thiol, octane thiol, decane thiol, dodecane thiol, hexadecane thiol, mercapto propyl silane, sulfur-trioctylphosphine (S-TOP), sulfur-tributylphosphine (S-TBP), sulfur-triphenylphosphine (S-TPP), sulfur-trioctylamine (S-TOA), bistrimethylsilyl sulfur, ammonium sulfide, sodium sulfide, or a combination thereof.

The selenium-containing precursor of the second shell precursor may be selenium-trioctylphosphine (Se-TOP), selenium-tributylphosphine (Se-TBP), selenium-triphenylphosphine (Se-TPP), selenium-diphenylphosphine (Se-DPP), or a combination thereof, but is not limited thereto.

In an embodiment, after core synthesis and during a shell growth, a solution including the shell precursors may be added to a reaction system over several times (e.g., in stages) in order for a composition of the shell to be changed or varied (e.g., in a radial direction). As non-limiting examples, in a case in which a shell of a ternary element (ABC) compound is formed, the sequence of the addition of the precursors, the amount of the precursors, and the reaction duration for the precursors (e.g., the A element precursor (e.g., a metal element such as Zn), the B element precursor (e.g., a first non-metal element such as sulfur), the C element precursor (e.g., a second non-metal element such as Se) solutions) may be adjusted. For example, the core is added to the A element precursor solution, the B element precursor solution is added thereto, and then a reaction is performed for a predetermined time. Subsequently, at least one of the C element precursor solution and the B element precursor solution may be added to the reaction system in a form of a mixture or individually and then a reaction is performed. Herein, addition timing and the reaction time of the C element precursor solution and the B element precursor solution and a ratio of these precursors in the reaction system may be controlled.

A lattice mismatch at an interface of the core and shell may be controlled by controlling the addition times and the addition timing of the C element precursor solution and the B element precursor solution and a ratio of the precursors in the reaction system. In addition, growth energy at the surface may be controlled by changing a reaction temperature and, for example, a kind of, the C element precursor.

The organic solvent may be a C6 to C22 primary amine such as a hexadecylamine, a C6 to C22 secondary amine such as dioctylamine, a C6 to C40 tertiary amine such as a trioctyl amine, a nitrogen-containing heterocyclic compound such as pyridine, a C6 to C40 olefin such as octadecene, a C6 to C40 aliphatic hydrocarbon such as hexadecane, octadecane, or squalane, an aromatic hydrocarbon substituted with a C6 to C30 alkyl group such as phenyldodecane, phenyltetradecane, or phenyl hexadecane, a primary, secondary, or tertiary phosphine (e.g., trioctyl phosphine) substituted with at least one (e.g., 1, 2, or 3) C6 to C22 alkyl group, a phosphine oxide (e.g., trioctylphosphine oxide) substituted with at least one (e.g., 1, 2, or 3) C6 to C22 alkyl group, a C12 to C22 aromatic ether such as a phenyl ether or a benzyl ether, or a combination thereof.

The organic ligand may coordinate to, e.g., be bound to, the surface of the produced nanocrystal and may have an effect on the light emitting and electric characteristics as well as may effectively disperse the nanocrystal in the solution phase. The organic ligand may include RCOOH, $RNH_2$, $R_2NH$, $R_3N$, RSH, $RH_2PO$, $R_2HPO$, $R_3PO$, $RH_2P$, $R_2HP$, $R_3P$, ROH, RCOOR, RHPOOH, $RPO(OH)_2$, RHPOOH (wherein, R is the same or different and is independently include a C1 to C24 substituted or unsubstituted aliphatic hydrocarbon group, C6 to C20 substituted or unsubstituted aromatic hydrocarbon group, or a combination thereof), or a combination thereof. The ligand may be may be used alone or in a mixture of two or more compounds.

Examples of the organic ligand compound may include methane thiol, ethane thiol, propane thiol, butane thiol, pentane thiol, hexane thiol, octane thiol, dodecane thiol, hexadecane thiol, octadecane thiol, benzyl thiol; methane amine, ethane amine, propane amine, butane amine, pentane amine, hexane amine, octane amine, dodecane amine, hexadecyl amine, oleyl amine, octadecyl amine, dimethyl amine, diethyl amine, dipropyl amine; methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, benzoic acid, palmitic acid, stearic acid; phosphine such as methyl phosphine, ethyl phosphine, propyl phosphine, butyl phosphine, pentyl phosphine, tributylphosphine, or trioctylphosphine; a phosphine oxide compound such as methyl phosphine oxide, ethyl phosphine oxide, propyl phosphine oxide, butyl phosphine oxide, or trioctylphosphine oxide; a diphenyl phosphine or triphenyl phosphine compound, or an oxide compound thereof; phosphonic acid, or the like, but are not limited thereto. The organic ligand compound may be used alone or in a mixture of two or more compounds. In an embodiment, the organic ligand compound may be a combination of RCOOH and amine (e.g., $RNH_2$, $R_2NH$, and/or $R_3N$).

Reaction conditions such as a reaction temperature or time for shell formation is not particularly limited and may be selected appropriately. In a non-limiting example embodiment, under a vacuum, a solvent and optionally the ligand compound are heated (or vacuum-treated) at a predetermined temperature (e.g., greater than or equal to about 100° C.), and are heated again at predetermined temperature (e.g., greater than or equal to about 100° C.) under an inert gas atmosphere. Subsequently, the core is added, the shell precursors are sequentially or simultaneously added, and then heated at a predetermined reaction temperature to perform a reaction. Mixture having different ratios of the shell precursors may be sequentially added for a reaction time.

After the completion of the reaction, a non-solvent is added to reaction products and the nanocrystal particles coordinated with, e.g., bound to, the ligand compound may be separated. The non-solvent may be a polar solvent that is miscible with the solvent used in the core formation and/or shell formation reactions and is not capable of dispersing the produced nanocrystals therein. The non-solvent may be selected depending the solvent used in the reaction and may be for example acetone, ethanol, butanol, isopropanol, ethanediol, water, tetrahydrofuran (THF), dimethylsulfoxide (DMSO), diethylether, formaldehyde, acetaldehyde, a solvent having a similar solubility parameter to the foregoing solvents, or a combination thereof. Separation of the nanocrystal particles may involve centrifugation, sedimentation, chromatography, or distillation. The separated nanocrystal particles may be added to a washing solvent and washed, if desired. Types of the washing solvent are not particularly limited and a solvent having similar solubility parameter to that of the ligand may be used and examples thereof may include hexane, heptane, octane, chloroform, toluene, benzene, or the like.

In an embodiment, an electronic device includes the semiconductor nanocrystal particle. The device may include a display device, a light emitting diode (LED), an organic light emitting diode (OLED), a quantum dot LED, a sensor, a solar cell, an image sensor, or a liquid crystal display (LCD), but is not limited thereto.

In an embodiment, the electronic device may be a LCD device, a photoluminescent element (e.g., a lighting such as a quantum dot sheet or a quantum dot rail or a liquid crystal display (LCD)) or a backlight unit for an electroluminescent device (e.g., QD LED).

In a non-limiting embodiment, the electronic device may include a quantum dot sheet and the semiconductor nanocrystal particle may be included in the quantum dot sheet (e.g., in a form of a semiconductor nanocrystal-polymer composite).

Figure 2:
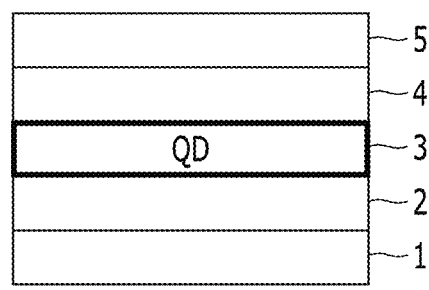
FIG. 2 is a schematic cross-sectional view of a quantum dot (QD) LED device according to a non-limiting embodiment.

In a non-limiting embodiment, the electronic device may be an electroluminescent device. The electronic device may include an anode 1 and a cathode 5 facing each other and a quantum dot emission layer 3 disposed between the anode and the cathode and including a plurality of quantum dots, and the plurality of quantum dots may include the blue light emitting semiconductor nanocrystal particle (see FIG. 2).

The cathode may include an electron injection conductor (for example, having a relatively low work function). The anode may include a hole injection conductor (for example, having a relatively high work function). The electron/hole injection conductors may include a metal (e.g., aluminum, magnesium, tungsten, nickel, cobalt, platinum, palladium, calcium, or LiF), a metal compound, an alloy, or a combination thereof; a metal oxide such as gallium indium oxide or indium tin oxide; or a conductive polymer such as polyethylene dioxythiophene (e.g., having a relatively high work function), but are not limited thereto.

At least one of the cathode and the anode may be a light transmitting electrode or a transparent electrode. In an embodiment, both of the anode and the cathode may be light transmitting electrodes. The electrode may be patterned.

The light transmitting electrode may be made of, for example a transparent conductor such as indium tin oxide (ITO) or indium zinc oxide (IZO), gallium indium tin oxide, zinc indium tin oxide, titanium nitride, polyaniline, or LiF/Mg:Ag, or a metal thin film of a thin monolayer or multilayer, but is not limited thereto. When one of the cathode and the anode is a non-light transmitting electrode, it may be made of, for example, an opaque conductor such as aluminum (Al), a lithium aluminum (Li:Al) alloy, a magnesium-silver alloy (Mg:Ag), or a lithium fluoride-aluminum (LiF:Al).

The light transmitting electrode may be disposed on a transparent substrate (e.g., insulating transparent substrate). The substrate may be rigid or flexible. The substrate may be a plastic, glass, or a metal.

Thicknesses of the anode and the cathode are not particularly limited and may be selected considering device efficiency. For example, the thickness of the anode (or the cathode) may be greater than or equal to about 5 nm, for example, greater than or equal to about 50 nm, but is not limited thereto. For example, the thickness of the anode (or the cathode) may be less than or equal to about 100 micrometers (μm), for example, less than or equal to about 10 um, less than or equal to about 1 μm, less than or equal to about 900 nm, less than or equal to about 500 nm, or less than or equal to about 100 nm, but is not limited thereto.

The quantum dot emission layer includes a plurality of quantum dots. The plurality of quantum dots includes the blue light emitting semiconductor nanocrystal particle according to the aforementioned embodiments. The quantum dot emission layer may include a monolayer of the blue light emitting semiconductor nanocrystal particles.

The quantum dot emission layer may be formed by preparing a dispersion including the quantum dots dispersed in a solvent, applying the dispersion via spin coating, ink jet coating, or spray coating, and drying the same. The emissive layer may have a thickness of greater than or equal to about 5 nm, for example, greater than or equal to about 10 nm, greater than or equal to about 15 nm, greater than or equal to about 20 nm, or greater than or equal to about 25 nm, and less than or equal to about 100 nm, for example, less than or equal to about 90 nm, less than or equal to about 80 nm, less than or equal to about 70 nm, less than or equal to about 60 nm, less than or equal to about 50 nm, less than or equal to about 40 nm, or less than or equal to about 30 nm.

The electronic device may include charge (hole or electron) auxiliary layers between the anode and the cathode. For example, the electronic device may include a hole auxiliary layer 2 or an electron auxiliary layer 4 between the anode and the quantum dot emission layer and/or between the cathode and the quantum dot emission layer. (see FIG. 2) In the figures, the electron/hole auxiliary layer is formed as a single layer, but it is not limited thereto and may include a plurality of layers including at least two stacked layers.

The hole auxiliary layer may include for example a hole injection layer (HIL) to facilitate hole injection, a hole transport layer (HTL) to facilitate hole transport, an electron blocking layer (EBL) to inhibit electron transport, or a combination thereof. For example, the hole injection layer may be disposed between the hole transport layer and the anode. For example, the electron blocking layer may be disposed between the emission layer and the hole transport (injection) layer, but is not limited thereto. A thickness of each layer may be selected appropriately. For example, a thickness of each layer may be greater than or equal to about 1 nm, greater than or equal to about 5 nm, greater than or equal to about 10 nm, greater than or equal to about 15 nm, greater than or equal to about 20 nm, or greater than or equal to about 25 nm, and less than or equal to about 500 nm, less than or equal to about 400 nm, less than or equal to about 300 nm, less than or equal to about 200 nm, less than or equal to about 100 nm, less than or equal to about 90 nm, less than or equal to about 80 nm, less than or equal to about 70 nm, less than or equal to about 60 nm, or less than or equal to about 50 nm, but is not limited thereto.

The hole injection layer may be an organic layer that is formed by a solution process (e.g., spin coating etc.) such as PEDOT:PSS. The hole transport layer may be an organic layer that is formed by a solution process (e.g., spin coating etc.).

The electron auxiliary layer may include for example an electron injection layer (EIL) to facilitate electron injection, an electron transport layer (ETL) to facilitate electron transport, a hole blocking layer (HBL) to inhibit hole transport, or a combination thereof. For example, the electron injection layer may be disposed between the electron transport layer and the cathode. For example, the hole blocking layer may be disposed between the emission layer and the electron transport (injection) layer, but is not limited thereto. A thickness of each layer may be selected appropriately. For example, a thickness of each layer may be greater than or equal to about 1 nm, greater than or equal to about 5 nm, greater than or equal to about 10 nm, greater than or equal to about 15 nm, greater than or equal to about 20 nm, or greater than or equal to about 25 nm, and less than or equal to about 500 nm, less than or equal to about 400 nm, less than or equal to about 300 nm, less than or equal to about 200 nm, less than or equal to about 100 nm, less than or equal to about 90 nm, less than or equal to about 80 nm, less than or equal to about 70 nm, less than or equal to about 60 nm, less than or equal to about 50 nm, but is not limited thereto. The electron injection layer may be an organic layer formed by deposition. The electron transport layer may include an inorganic oxide or a (nano or fine) particles thereof or may include an organic layer formed by deposition.

The quantum dot emission layer may be disposed in or on the hole injection (or transport) layer or an electron injection (or transport) layer. The quantum dot emission layer may be disposed as a separate layer between the hole auxiliary layer and the electron auxiliary layer.

The charge auxiliary layer, the electron blocking layer, and the hole blocking layer may include for example an organic material, an inorganic material, or an organic/inorganic material. The organic material may be a compound having hole or electron-related properties. The inorganic material may be for example a metal oxide such as molybdenum oxide, tungsten oxide, zinc oxide, or nickel oxide, but is not limited thereto.

The hole transport layer (HTL) and/or the hole injection layer may include for example poly(3,4-ethylenedioxythiophene):poly(styrene sulfonate) (PEDOT:PSS), poly(9,9-dioctyl-fluorene-co-N-(4-butylphenyl)-diphenylamine) (TFB), polyarylamine, poly(N-vinylcarbazole, PVK), polyaniline, polypyrrole, N,N,N',N'-tetrakis (4-methoxyphenyl)-benzidine (TPD), 4,4',-bis[N-(1-naphthyl)-N-phenyl-amino]biphenyl (α-NPD), m-MTDATA (4,4',4''-tris[phenyl(m-tolyl)amino]triphenylamine), 4,4',4''-tris(N-carbazolyl)-triphenylamine (TCTA), 1,1-bis[(di-4-tolylamino) phenylcyclohexane (TAPC), a p-type metal oxide (e.g., NiO, $WO_3$, $MoO_3$, etc.), a carbonaceous material such as grapheme oxide, or a combination thereof, but is not limited thereto.

The electron blocking layer (EBL) may include for example poly(3,4-ethylenedioxythiophene):poly(styrene sulfonate) (PEDOT:PSS), poly(9,9-dioctyl-fluorene-co-N-(4-butylphenyl)-diphenylamine) (TFB) polyarylamine, poly(N-vinylcarbazole), polyaniline, polypyrrole, N,N,N',N'-tetrakis(4-methoxyphenyl)-benzidine (TPD), 4-bis[N-(1-naphthyl)-N-phenyl-amino]biphenyl (α-NPD), m-MTDATA, 4,4',4''-tris(N-carbazolyl)-triphenylamine (TCTA), or a combination thereof, but is not limited thereto.

The electron transport layer (ETL) and/or the electron injection layer may include for example 1,4,5,8-naphthalene-tetracarboxylic dianhydride (NTCDA), bathocuproine (BCP), tris[3-(3-pyridyl)-mesityl]borane (3TPYMB), LiF, $Alq_3$, $Gaq_3$, $Inq_3$, $Znq_2$, $Zn(BTZ)_2$, $BeBq_2$, ET204 (8-(4-(4,6-di(naphthalen-2-yl)-1,3,5-triazin-2-yl)phenyl)quinolone), 8-hydroxyquinolinato lithium (Liq), an n-type metal oxide (e.g., ZnO, $HfO_2$, etc.), or a combination thereof, but is not limited thereto. In the foregoing "q" is 8-hydroxyquinoline, "BTZ" is 2-(2-hydroxyphenyl)benzothiazolate, and "Bq" is 10-hydroxybenzo[h]quinoline.

The hole blocking layer (HBL) may include for example 1,4,5,8-naphthalene-tetracarboxylic dianhydride (NTCDA), bathocuproine (BCP), tris[3-(3-pyridyl)-mesityl]borane (3TPYMB), LiF, $Alq_3$, $Gaq_3$, $Inq_3$, $Znq_2$, $Zn(BTZ)_2$, $BeBq_2$, or a combination thereof, but is not limited thereto.

Figure 3:
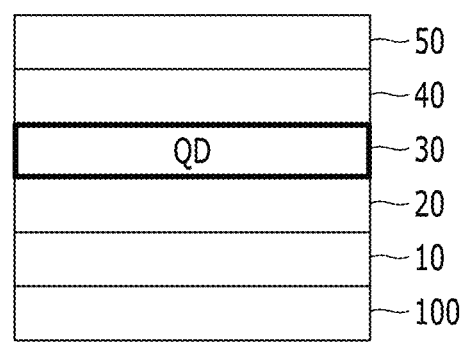
FIG. 3 is a schematic cross-sectional view of a QD LED device according to a non-limiting embodiment.

In a device according to an embodiment, an anode 10 disposed on a transparent substrate 100 may include a metal oxide transparent electrode (e.g., ITO electrode) and a cathode 50 facing the anode may include a metal (Mg, Al, etc.) of a predetermined (e.g., relatively low) work function. For example, a hole auxiliary layer 20 (e.g., a hole transport layer including TFB and/or PVK and/or a hole injection layer including PEDOT:PSS and/or a p-type metal oxide) may be disposed between the transparent electrode 10 and the emission layer 30. An electron auxiliary layer (e.g., electron transport layer) 40 may be disposed between the quantum dot emission layer 30 and the cathode 50. (see FIG. 3) A device according to an embodiment has an inverted structure.

Figure 4:
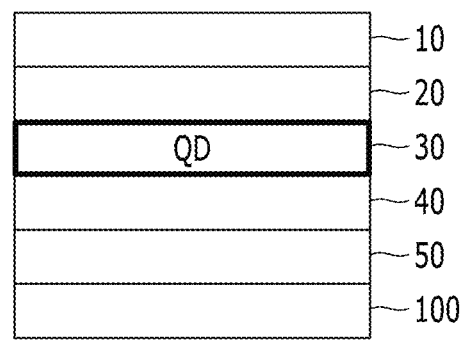
FIG. 4 is a schematic cross-sectional view of a QD LED device according to a non-limiting embodiment.

Herein, a cathode 50 disposed on a transparent substrate 100 may include a metal oxide transparent electrode (e.g., ITO) and an anode 10 facing the cathode may include a metal (e.g., Au, Ag, etc.) of a predetermined (e.g., relatively high) work function. For example, an n-type metal oxide (ZnO) may be disposed between the transparent electrode 50 and the emission layer 30 as an electron auxiliary layer (e.g., an electron transport layer) 40. A hole auxiliary layer 20 (e.g., a hole transport layer including TFB and/or PVK and/or a hole injection layer including $MoO_3$ or another p-type metal oxide) may be disposed between the metal anode 10 and the quantum dot emission layer 30. (see FIG. 4)

Hereinafter, specific examples are illustrated. However, these examples are exemplary, and the present disclosure is not limited thereto.

EXAMPLES

Analysis Method

[1] Photoluminescence Analysis

A photoluminescence (PL) spectrum of the produced nanocrystals are obtained using a Hitachi F-7000 spectrometer at an irradiation wavelength of 372 nm.

[2] Ultraviolet (UV) Spectroscopy Analysis

UV spectroscopy analysis is performed using a Hitachi U-3310 spectrometer to obtain a UV-Visible absorption spectrum.

[3] TEM Analysis (1) Transmission electron microscope photographs of nanocrystals are obtained using an UT F30 Tecnai electron microscope.

(2) TEM-EDX analysis (elemental mapping) is performed using an UT F30 Tecnai electron microscope.

[4] ICP Analysis

An inductively coupled plasma-atomic emission spectroscopy (ICP-AES) analysis is performed using Shimadzu ICPS-8100.

[5] HRTEM Analysis

A HRTEM analysis is performed using TEM-Titan G2.

[6] X-Ray Diffraction Analysis

XRD analysis is performed using a Philips XPert PRO equipment with a power of 3 kW to confirm crystal structures of the semiconductor nanocrystals.

Synthesis is performed under an inert gas atmosphere (nitrogen flowing condition) unless particularly mentioned.

Example 1: Production of ZnTeSe Core I

Selenium and tellurium are dispersed in trioctylphosphine (TOP) to obtain a 2 M Se/TOP stock solution and a 0.1 M Te/TOP stock solution.

10 milliliters (mL) of trioctylamine is added to a reactor together with 0.125 millimoles (mmol) of zinc acetate, 0.25 mmol of palmitic acid, and 0.25 mmol of hexadecyl amine and the mixture is heated under a vacuum at 120° C. In one hour, an atmosphere in the reactor is converted into nitrogen.

Figure 5:
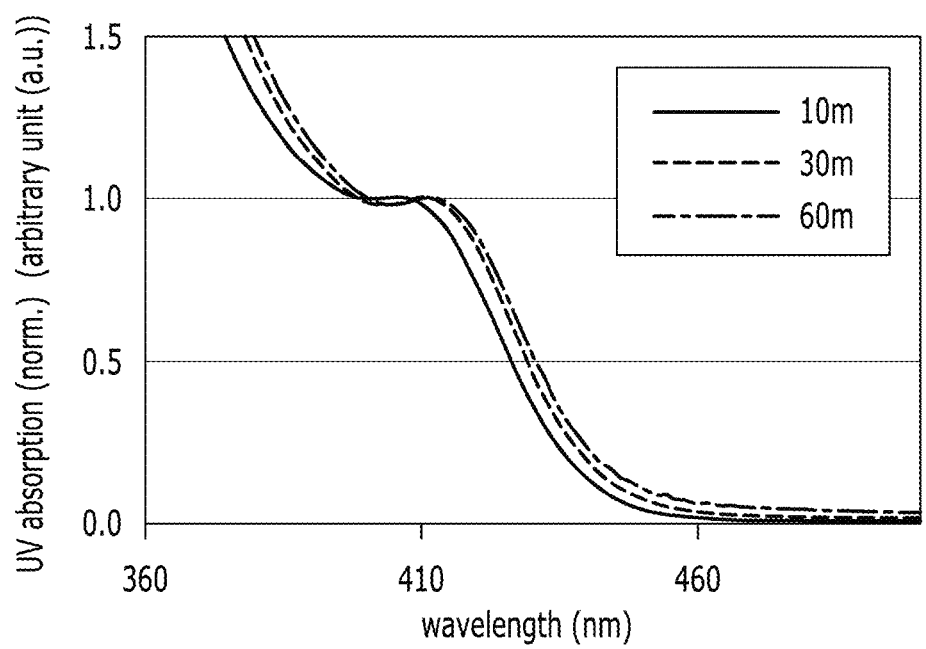
FIG. 5 shows ultraviolet-visible (UV-Vis) absorption spectra of the ZnTeSe cores produced in Examples.
Figure 6:
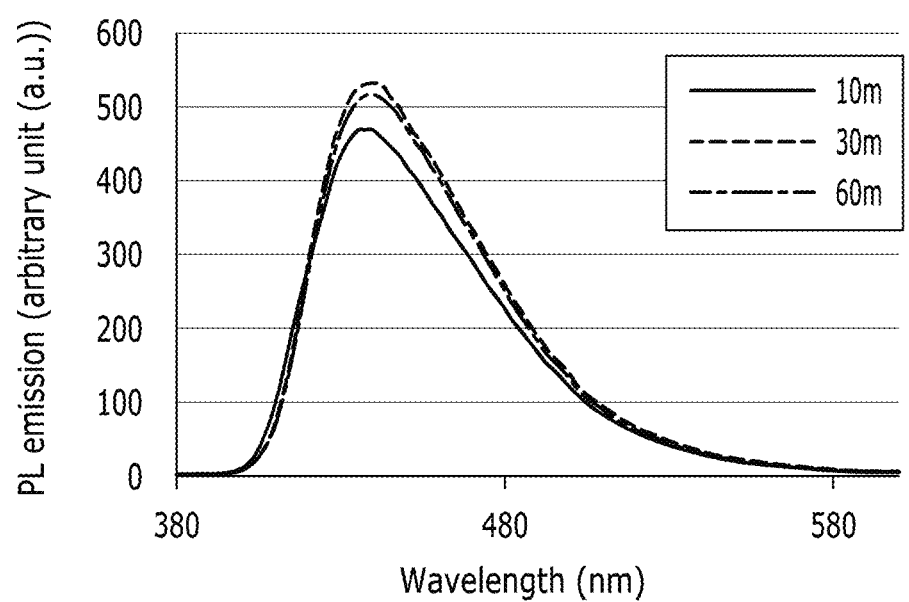
FIG. 6 shows photoluminescence (PL) spectra of the ZnTeSe cores produced in Examples.

After the mixture is heated at 300° C., the prepared Se/TOP stock solution and Te/TOP stock solution are rapidly added in a Te/Se ratio of 1/25. After 10 minutes (10 m), 30 minutes (30 m), or 60 minutes (60 m), acetone is added to a reaction solution that is rapidly cooled to room temperature and precipitates obtained by centrifugation are dispersed in toluene. UV-vis spectroscopy analysis and photoluminescence spectroscopy analysis of the obtained semiconductor nanocrystal particle are performed and the results are shown in FIGS. 5 and 6. As a result, it is confirmed that the obtained semiconductor nanocrystal has a first absorption maximum wavelength of 400 nm to 430 nm and a maximum peak emission wavelength of 430 nm to 460 nm. It is confirmed that quantum efficiency of the produced semiconductor nanocrystal is about 30-40%.

Figure 7:
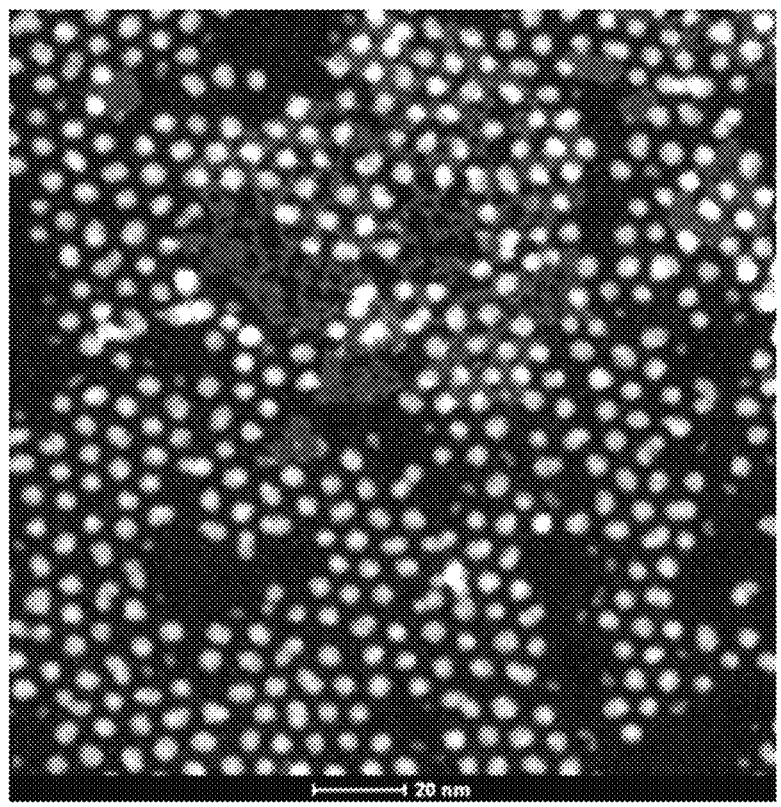
FIG. 7 shows a transmission electron microscope (TEM) image of the ZnTeSe cores produced in Examples.
Figure 8:
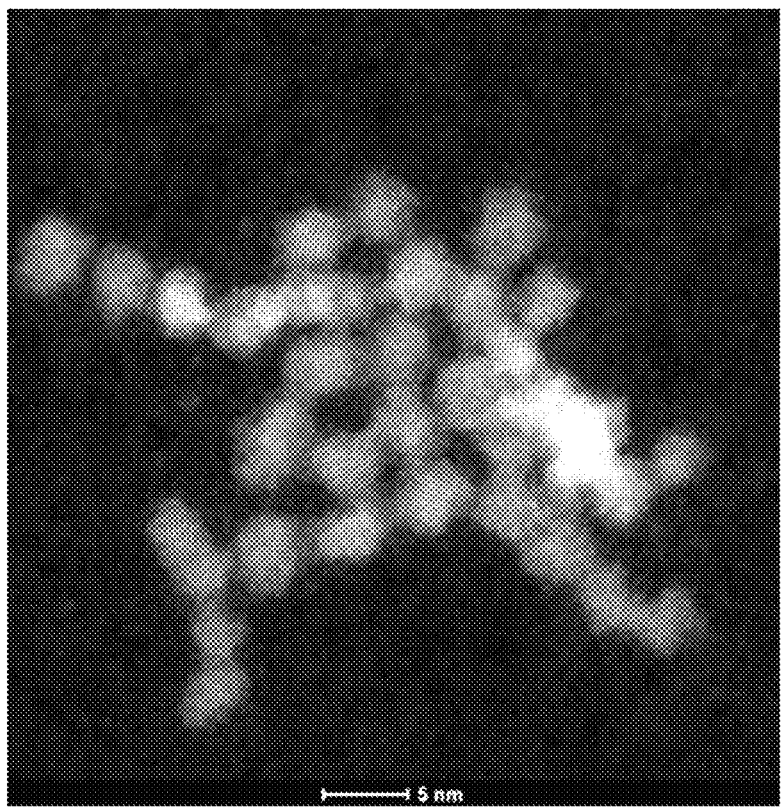
FIG. 8 shows a High-Resolution Transmission Electron Microscopy (HRTEM) image of the ZnTeSe cores produced in Examples.
Figure 9:
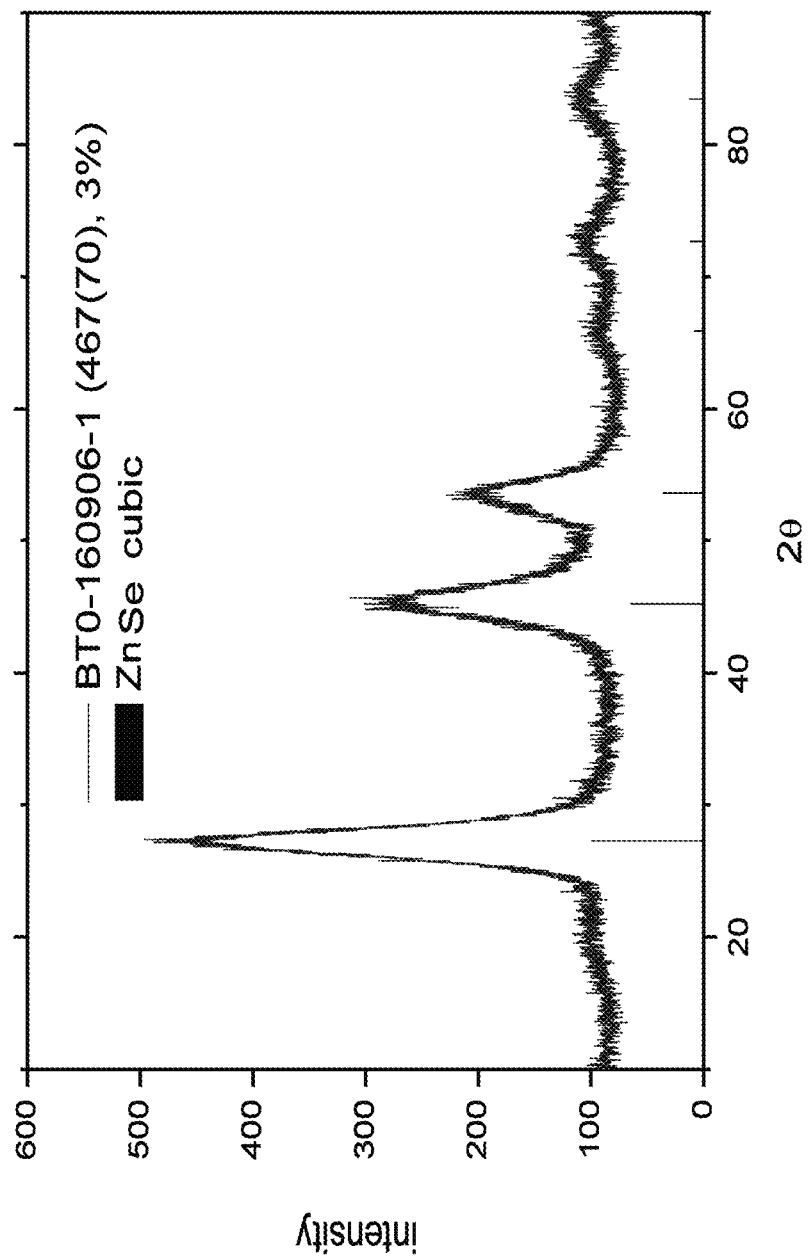
FIG. 9 shows an X-ray diffraction spectrum of the ZnTeSe core produced in Example.

A transmission electron microscope image of the semiconductor nanocrystal particle where a reaction time is 60 minutes is shown in FIG. 7. A HRTEM image of the semiconductor nanocrystal particle where a reaction time is 60 minutes is shown in FIG. 8. From the transmission electron microscope analysis result, it is confirmed that spherical shapes/polygon particles are formed. An X-ray diffraction analysis of the semiconductor nanocrystal particle where a reaction time is 60 minutes is performed and the result is shown in FIG. 9. From the result of FIG. 9, it is confirmed that the produced core has a ZnSe cubic crystal structure.

Examples 2-1 to 2-5: Production of ZnTeSe Core II

The cores are prepared in the same manner as set forth in Example 1 except that the ratios of selenium and tellurium are changed as set forth in Table 1(reaction time: 30 to 60 minutes).

Maximum light emitting peak wavelengths and full widths at half maximum (FWHM) of the prepared cores and the weight ratios of tellurium of the produced semiconductor nanocrystal (confirmed by ICP) are compiled in Table 1.

TABLE 1

| | Te/Se ratio of Reaction system | Maximum light emitting peak wavelength (nm) | Full width at half maximum (FWHM) (nm) | Amount of Te (wt %) |
|---|---|---|---|---|
| Example 2-1 | 0 | 422 | 24 | 0 |
| Example 2-2 | 1/50 | 431 | 48 | 1.78 |
| Example 2-3 | 1/30 | 441 | 57 | 2.82 |
| Example 2-4 | 1/25 | 445 | 57 | 3.34 |
| Example 2-5 | 1/8 | 478 | 67 | 7.5 |

Example 3: Core-Shell Semiconductor Nanocrystal of ZnTeSe Core/Shell of ZnSeS Gradient Composition 1.8 mmol (0.336 grams (g)) of zinc acetate, 3.6 mmol (1.134 g) of oleic acid, and 10 mL of trioctylamine are added to a flask and vacuum-treated at 120° C. for 10 minutes. The inside atmosphere of the flask is substituted with nitrogen ($N_2$) and then a temperature is increased to 180° C. The ZnTeSe core (reaction time: 60 minutes) prepared in Example 1 is added thereto within 10 seconds, subsequently 0.04 mmol of Se/TOP is slowly added, and a temperature is increased to 280° C. Then, 0.01 mmol of S/TOP is added and a temperature is increased to 320° C. and a reaction is performed for 10 minutes. Subsequently, a mixed solution including 0.02 mmol of Se/TOP and 0.04 mmol of S/TOP is slowly added, and a reaction is performed for 20 minutes (hereinafter, this step may be referred to as step A). Then, mixing ratios of Se and S are changed, and then the mixed solutions of Se and S are added, and reactions are performed for 20 minutes. Herein, the mixed solution of Se and S are a mixed solution of Se/TOP 0.01 mmol+S/TOP 0.05 mmol, a mixed solution (hereinafter, this step may be referred to as step B) of Se/TOP 0.005 mmol+S/TOP 0.1 mmol, and a solution of S/TOP 0.5 mmol, which are sequentially used.

The reactions are completed, the reactor is cooled, and the obtained nanocrystal particles are centrifuged with ethanol and dispersed in toluene.

Figure 10:
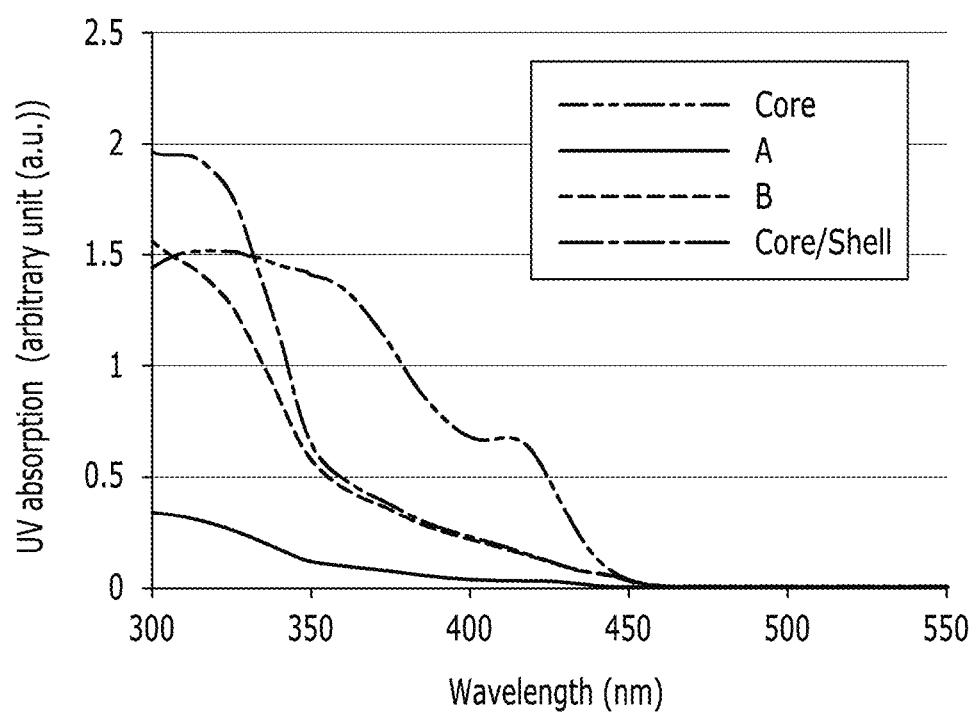
FIG. 10 shows UV-vis absorption spectrums of the semiconductor nanocrystals during a production (core, A step, B step, and produced core-shell) in Example 3, respectively.
Figure 11:
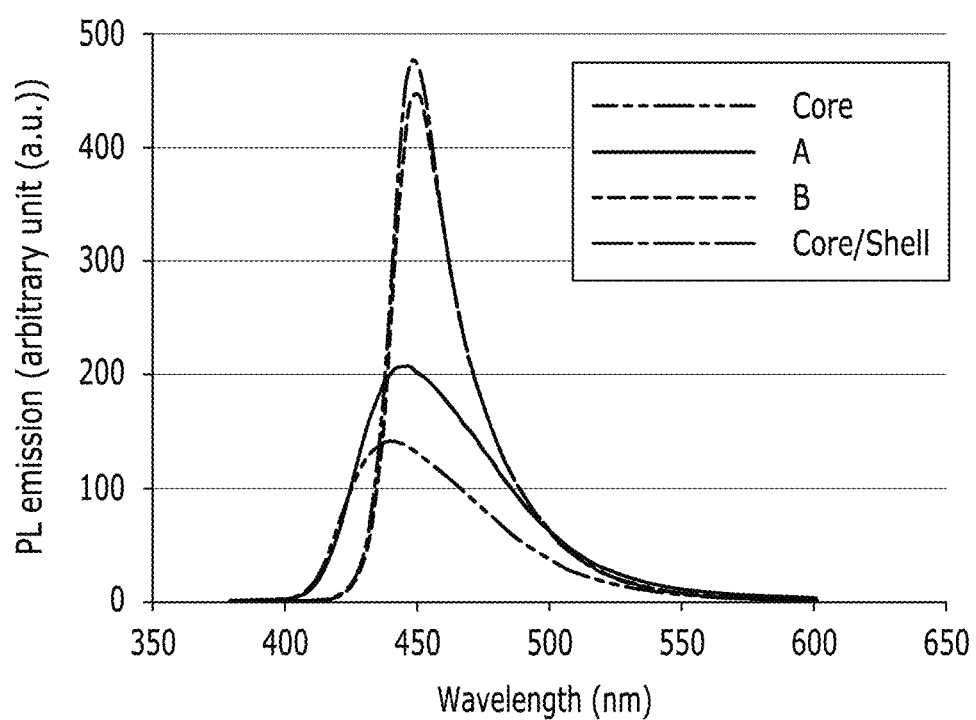
FIG. 11 shows PL spectrums of the semiconductor nanocrystals during production (core, A step, B step, and produced core-shell) in Example 3, respectively.
Figure 12:
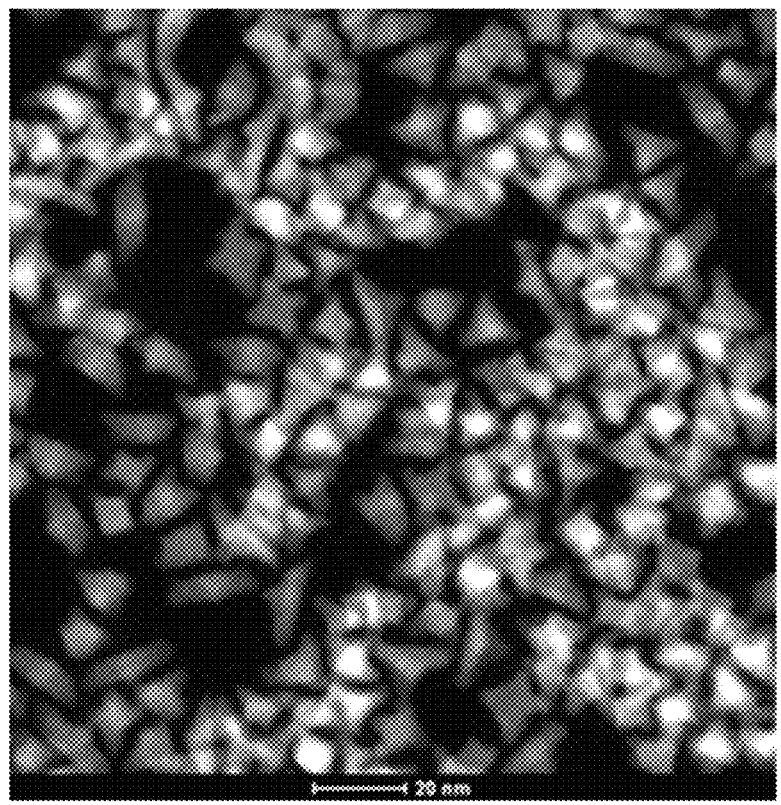
FIG. 12 shows a transmission electron microscope image of the semiconductor nanocrystals produced in Example 3.

UV-vis spectroscopy analysis, photoluminescence analysis, and transmission electron microscope analysis of the nanocrystals during the production (core, step A, and step B) and (core-shell) nanocrystals as prepared are performed and the results are shown in FIGS. 10, 11, and 12.

From the photoluminescence analysis result, it is confirmed that the produced quantum dot has a maximum light emitting peak of 449 nm (full width at half maximum (FWHM) 28 nm) and quantum efficiency of 70%.

The results confirmed that the formation of the shell causes a shift of the maximum luminescent peak wavelength to a longer wavelength and a decrease in the FWHM and an increase in the quantum yield.

It is confirmed that the semiconductor nanocrystal particle as prepared has a multipod shape.

It is confirmed that the semiconductor nanocrystal particle as prepared have a particle diameter of 10 nm to 20 nm.

An inductively coupled plasma atom light emitting spectroscopy analysis of ZnTeSe core and ZnTeSe (core)/ZnSeS/ZnS is performed and the results (a mole ratio to Zn) are shown in Table 2.

TABLE 2

| | S | Zn | Se | Te | (Se + S)/Zn |
|---|---|---|---|---|---|
| ZnTeSe core | 0 | 1 | 0.792 | 0.018 | 0.792 |
| ZnTeSe (core)/ZnSeS/ZnS | 0.390 | 1 | 0.472 | 0.004 | 0.862 |

Figure 13:
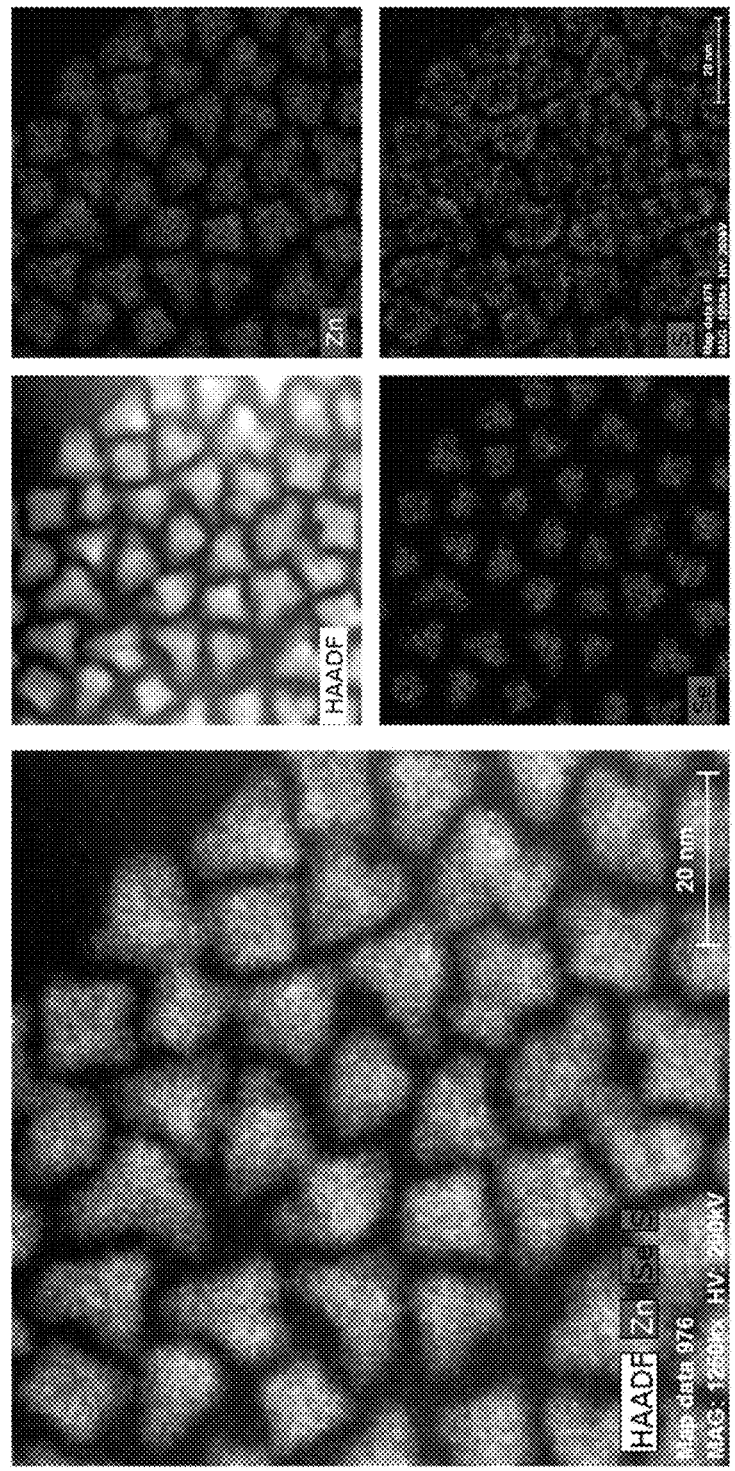
FIG. 13 shows a transmission electron microscopy-energy dispersive X-ray (TEM-EDX) (elemental mapping) analysis result of the semiconductor nanocrystal produced in Example 3.

A TEM-EDX analysis (elemental mapping) of the produced semiconductor nanocrystal particle is performed and the result is shown in FIG. 13. From FIG. 13, it is confirmed that a shell having an outer-layer including the sulfur is formed.

Comparative Example 1

ZnTeSe (core)/ZnSeS/ZnS (shell) particles are prepared in the same manner as set forth in Example 3 except for using a core prepared in Example 2-5 (the ratio between the precursors Te/Se=1/8). An ICP-AES analysis is performed for the prepared ZnTeSe (core)/ZnSeS/ZnS (shell) particles. The results confirm that the mole ratio of the tellurium to the selenium is 0.024. The photoluminescent analysis is made for the prepared particles. The results confirm that the PL wavelength thereof is 487 nm, the FWHM is 44 nm, and the QY is 37%.

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:
1. A semiconductor nanocrystal particle comprising zinc,
tellurium, and
selenium, wherein a mole ratio of the tellurium to the selenium is less than 0.01:1,
wherein the semiconductor nanocrystal particle emits blue light comprising a maximum peak emission at a wavelength of greater than or equal to 449 nanometers (nm) and less than or equal to about 470 nanometers (nm), and
wherein the maximum peak emission has a full width at half maximum of less than or equal to about 40 nm or wherein the semiconductor nanocrystal particle is configured to show a quantum efficiency of greater than or equal to about 60%.

2. The semiconductor nanocrystal particle of claim 1, wherein a mole ratio of the tellurium to the selenium is greater than or equal to about 0.001:1.

3. The semiconductor nanocrystal particle of claim 1, wherein a mole ratio of the tellurium to the selenium is from about 0.002:1 to about 0.007:1.

4. The semiconductor nanocrystal particle of claim 1, wherein a mole ratio of the tellurium to the zinc is less than or equal to about 0.03:1.

5. The semiconductor nanocrystal particle of claim 1, wherein an amount of the tellurium is less than or equal to about 1 weight percent, based on a total weight of the semiconductor nanocrystal particle, and optionally wherein the semiconductor nanocrystal particle does not comprise cadmium.

6. The semiconductor nanocrystal particle of claim 1, wherein a size of the semiconductor nanocrystal particle is greater than or equal to about 6 nanometers and less than or equal to about 50 nanometers.

7. The semiconductor nanocrystal particle of claim 1, wherein the semiconductor nanocrystal particle further comprises sulfur and
optionally wherein an amount of sulfur in an inner portion of the semiconductor nanocrystal particle is less than in an outer portion of the semiconductor nanocrystal particle.

8. The semiconductor nanocrystal particle of claim 7, wherein a mole ratio of sulfur to zinc is greater than or equal to about 0.1:1, and optionally wherein a mole ratio of a sum of selenium and sulfur to zinc is less than or equal to about 1:1.

9. The semiconductor nanocrystal particle of claim 1, wherein the particle comprises a core comprising a first semiconductor material comprising zinc, tellurium, and selenium and a shell disposed on at least a portion of the core and comprising a second semiconductor material having a different composition from the first semiconductor material, and
optionally wherein the shell comprises a first layer disposed directly on the core, and an outermost layer, wherein the first layer comprises ZnSeS and the outermost layer comprises ZnS.

10. The semiconductor nanocrystal particle of claim 1, wherein the maximum peak emission is at a wavelength of greater than or equal to 450 nanometers to about 465 nanometers.

11. The semiconductor nanocrystal particle of claim 1, wherein the maximum peak emission has a full width at half maximum of less than or equal to about 34 nanometers, or
wherein the semiconductor nanocrystal particle has quantum efficiency of greater than or equal to about 70%.

12. An electroluminescent device comprising an anode and a cathode facing each other and an emission layer disposed between the anode and the cathode and comprising a plurality of semiconductor nanocrystal particles,
wherein the plurality of semiconductor nanocrystal particles comprises zinc, tellurium, selenium, and optionally sulfur, wherein a mole ratio of the tellurium to the selenium is less than 0.01:1, wherein the plurality of semiconductor nanocrystal particles is configured to emit blue light comprising a maximum peak emission at a wavelength of greater than or equal to 449 nanometers (nm).

13. The electroluminescent device of claim 12, wherein the plurality of semiconductor nanocrystal particles further comprise sulfur, and wherein in the plurality of semiconductor nanocrystal particles, a mole ratio of sulfur to zinc is greater than or equal to about 0.1:1, and a mole ratio of a sum of selenium and sulfur to zinc is less than or equal to about 1:1.

14. The electroluminescent device of claim 13, wherein in the plurality of semiconductor nanocrystal particles, a mole ratio of sulfur to zinc is greater than or equal to about 0.2:1 and a mole ratio of a sum of selenium and sulfur to zinc is greater than or equal to about 0.3:1.

15. The electroluminescent device of claim 12, wherein the maximum peak emission has a full width at half maximum of less than or equal to about 40 nanometers, or
wherein the semiconductor nanocrystal particle has quantum efficiency of greater than or equal to about 60%.

16. The electroluminescent device of claim 12, wherein the maximum peak emission is at a wavelength of greater than or equal to 450 nanometers to about 470 nanometers.

17. The electroluminescent device of claim 12, wherein the emission layer has a thickness of from about 30 nm to about 100 nm.

18. The electroluminescent device of claim 12, wherein the electroluminescent device further comprises a hole auxiliary layer between the anode and the emission layer, an electron auxiliary layer between the cathode and the emission layer, or a combination thereof.

19. A display device comprising an electroluminescent device of claim 12.

\* \* \* \* \*